United States Patent
Lewis et al.

(10) Patent No.: US 9,024,683 B1
(45) Date of Patent: May 5, 2015

(54) METHOD AND APPARATUS FOR REDUCING POWER SPIKES CAUSED BY CLOCK NETWORKS

(71) Applicant: Altera Corporation, San Jose, CA (US)

(72) Inventors: David Lewis, Toronto (CA); Ryan Fung, Mississauga (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/022,931

(22) Filed: Sep. 10, 2013

Related U.S. Application Data

(62) Division of application No. 12/589,031, filed on Oct. 16, 2009, now Pat. No. 8,558,599.

(51) Int. Cl.
H03K 5/00 (2006.01)
(52) U.S. Cl.
CPC .................................... *H03K 5/00* (2013.01)
(58) Field of Classification Search
USPC ............................. 327/292–299, 551–559, 34
See application file for complete search history.

(56) References Cited

U.S. PATENT DOCUMENTS

| | | | |
|---|---|---|---|
| 6,262,614 B1* | 7/2001 | Sasaki | 327/198 |
| 6,563,336 B1 | 5/2003 | Bobba et al. | |
| 6,708,314 B2 | 3/2004 | Trivedi et al. | |
| 6,788,119 B1 | 9/2004 | Hyland et al. | |
| 6,828,852 B2 | 12/2004 | Klass et al. | |
| 6,919,619 B2 | 7/2005 | Sylvester et al. | |
| 7,126,405 B2* | 10/2006 | Fairbanks | 327/293 |
| 7,795,991 B2* | 9/2010 | El Rai et al. | 333/18 |
| 2010/0049481 A1 | 2/2010 | Walker et al. | |

OTHER PUBLICATIONS

U.S. Appl. No. 12/589,031, filed Oct. 16, 2009, in Re Application of David Lewis, et al.

* cited by examiner

*Primary Examiner* — Dinh Le
(74) *Attorney, Agent, or Firm* — L. Cho

(57) ABSTRACT

A clock network includes a first plurality of shield wires associated with a first plurality of clock lines and a second plurality of shield wires associated with a second plurality of clock lines. The clock network also includes a first plurality of clock activity program circuits associated with the first plurality of clock lines and a second plurality of clock activity program circuits associated with the second plurality of clock lines, wherein the first and second plurality of shield wires and the first and second plurality clock activity program circuits are configured to reduce power spikes.

24 Claims, 22 Drawing Sheets clock

Idd (logic)

Idd (clock)

Vint

METHOD AND APPARATUS FOR REDUCING POWER SPIKES CAUSED BY CLOCK NETWORKS

RELATED APPLICATIONS

This application is a divisional of and claims priority and benefit to U.S. application Ser. No. 12/589,031 filed on Oct. 16, 2009, entitled, "Method and Apparatus for Reducing Power Spikes Caused by Clock Networks".

TECHNICAL FIELD

An embodiment of the present invention relates to clock networks in devices implemented on target devices such as application specific integrated circuits (ASICs) and field programmable gate arrays (FPGAs). More specifically, embodiments of the present invention relate to a method and apparatus for reducing power spikes caused by clock networks.

BACKGROUND

During circuit switching, transient currents can cause power supply collapse on very large scale integration (VLSI) devices. As current discharges, decoupling capacitance and the power distribution network may have difficulty supplying sufficient current. A current supply collapse may cause logic delay increase or other functional faults in the device. Typically in clocked circuits, the positive clock edge will arrive and cause a wave of activity and a corresponding current spike at each clock cycle. The current spike may create a voltage sag and prevent reliable operation of the target device.

FIG. 1a illustrates an exemplary logic circuit that represents an abstraction of a system implemented on a target device. As shown, a single inverter drives node N with equal capacitive loads C1 and C2. The nominal reference terminals for C1 and C2 are Vdd and ground respectively. The capacitive loads, C1 and C2, may be derived from logic and wire and metal capacitance, and shield wires on the target device. Also shown is inductance between the power supply and on-die circuits. As shown in FIG. 1b a rising transition on the load N causes C2 to charge through the power supply path, and a falling transition on N causes C1 to charge through the power supply path. A rising transition on N causes only internal power dissipation of the charge in C1, which does not affect the power supply. Similarly, a falling transition on N only causes internal power dissipation of the charge in C2.

FIG. 2a illustrates a clock pulse. FIG. 2b illustrates the current waveform associated with logic on the device. As shown, the logic on a device typically has a large amount of activity shortly after a positive clock edge. The clock edge causes the flip-flops to switch and a subsequent wave of activity propagates through the combinatorial logic. FIG. 2c illustrates the current waveform associated with a clock network. As shown, the clock network exhibits a current waveform with two narrow spikes at the positive and negative edges of the clock waveform. This leads to a pair of unequal voltage transients at each clock edge as illustrated in FIG. 2d.

In the past, designers added decoupling capacitance on the device to address this problem. The decoupling capacitance required, however, would often need to be several times larger than the capacitive load on the original design. In addition to adding to the cost of the design, the decoupling capacitance had to be built in between Vdd and ground and required a large amount of area, which was undesirable.

Prior approaches used to address clock current did not rely on the details of the relationship of the clock current waveforms to the details of the power distribution network. The analysis in FIGS. 1a-b and 2a-d show the details of how a logic transition to a voltage that is the same as the opposite terminal in the parasitic capacitance causes current that flows completely within the integrated circuit, and therefore does not cause any transient current external to this chip. Since most of the power supply impedance lies off chip, this is the primary source of voltage noise on the chip. In contrast, prior approaches did not distinguish between on-chip and off chip currents. Therefore they considered all current created during a clocking transient to be important, neglecting the significant difference between on-chip and off-chip current. Furthermore these treatments did not consider the possibility of the parasitic clock capacitance to be distributed between Gnd and Vdd, but assumed that it was all connected to Gnd.

SUMMARY

According to an embodiment of the present invention, current spikes associated with a clocking network are adjusted to reduce voltage sags in a system. The current spike may be evenly spread or "smeared out" across the clock cycle or shifted towards a falling edge period of a clock cycle. The adjustments made to the current spikes may be achieved by adjusting clock polarities and/or adjusting the power supply rail to be used by clock lines for shielding. For FPGAs, clock activity program circuits may be used to configure a configurable clock polarity network to minimize noise.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 3:
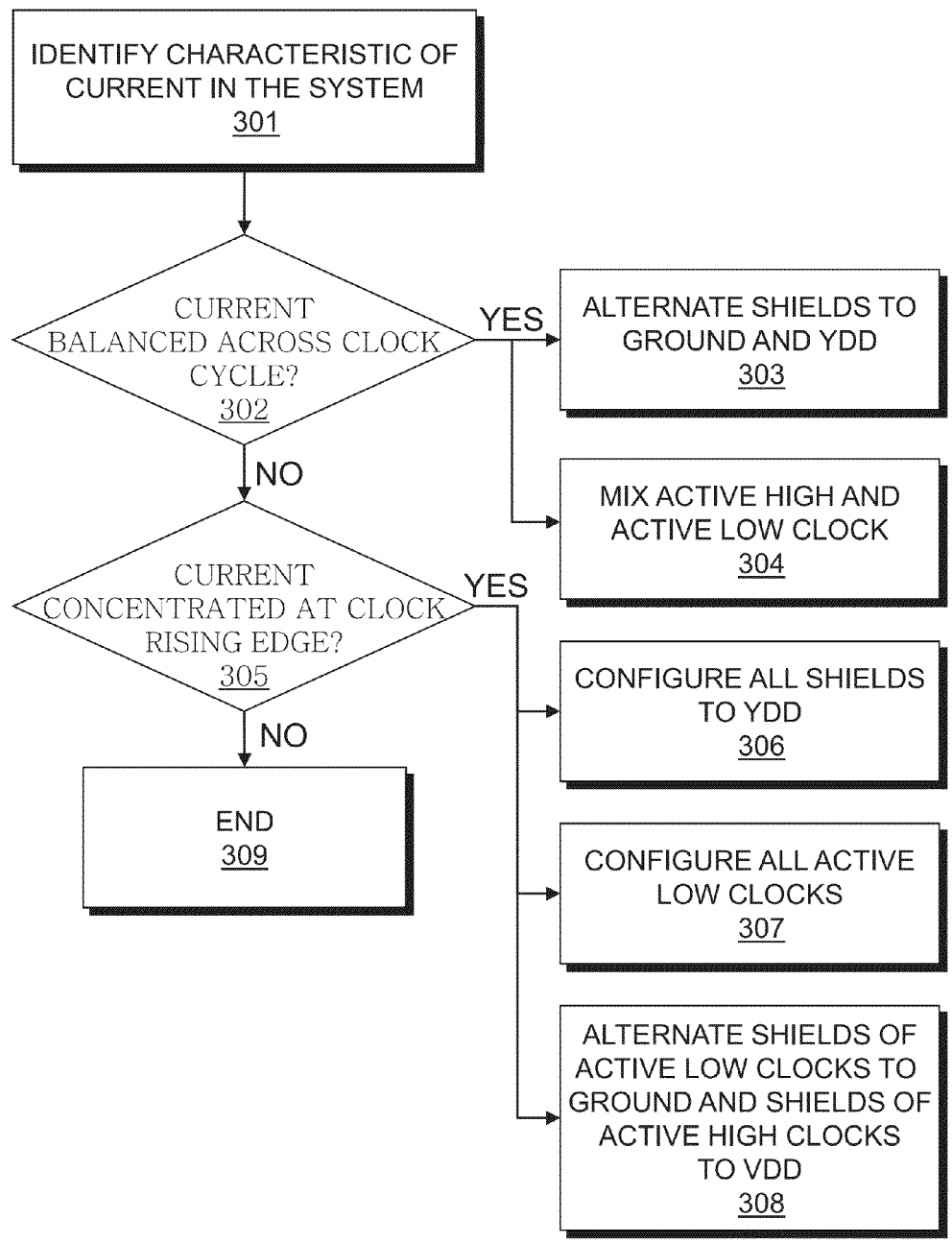
FIG. 3 is a flow chart illustrating a method for designing a clock network for a system on a target device according to an embodiment of the present invention.

FIG. 3 is a flow chart illustrating a method for designing a clock network for a system on a target device according to an embodiment of the present invention. At 301, characteristics of current in the system are identified. According to an embodiment of the present invention, the characteristic of current for logic is identified. The characteristic may include information regarding whether the current is approximately the same (roughly balanced) across clock cycles or concentrated at the rising edge of the clock cycles. The identification may be achieved using simulations, statistical analysis, actual tests, or other techniques.

Figure 4A:
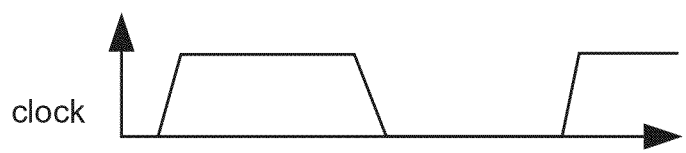
FIGS. 4a-4d illustrate the current and voltage characteristics of a system having logic current roughly balanced across a clock cycle.
Figure 4B:
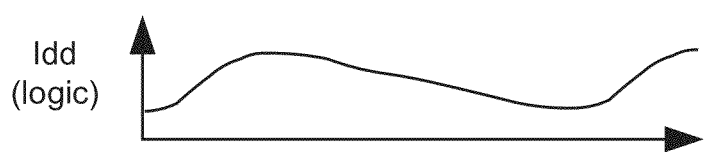
Figure 4C:
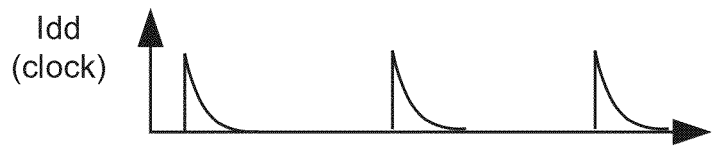
Figure 4D:
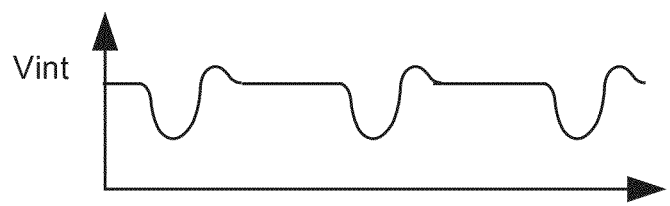

At 302, if current is approximately the same across clock cycles, control proceeds to one of 303 and 304. If current is not approximately the same across clock cycles, control proceeds to 305. FIG. 4a-4d illustrates the current and voltage characteristics of a system having logic current roughly balanced across clock cycles. FIG. 4a illustrates the clock pulse for the system over time. FIG. 4b illustrates the logic current for the system over time. FIG. 4c illustrates the clock current for the system over time. The clock network exhibits a current waveform with two narrow spikes at the positive and negative edges of the clock waveform respectively, when C1 and C2 are equal. This leads to a pair of equal voltage transients at each clock edge as illustrated in FIG. 4d.

Figure 1A:
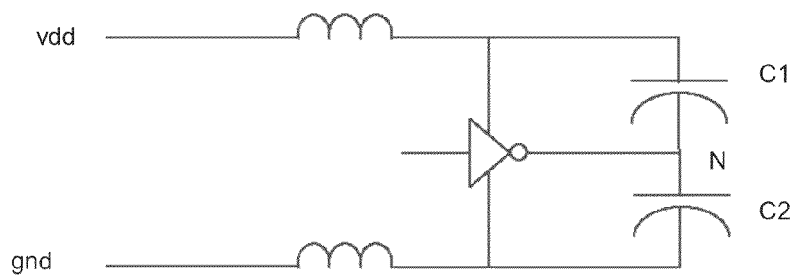
FIGS. 1a-1b illustrate exemplary logic circuits that represent an abstraction of a system implemented on a target device.
Figure 1B:
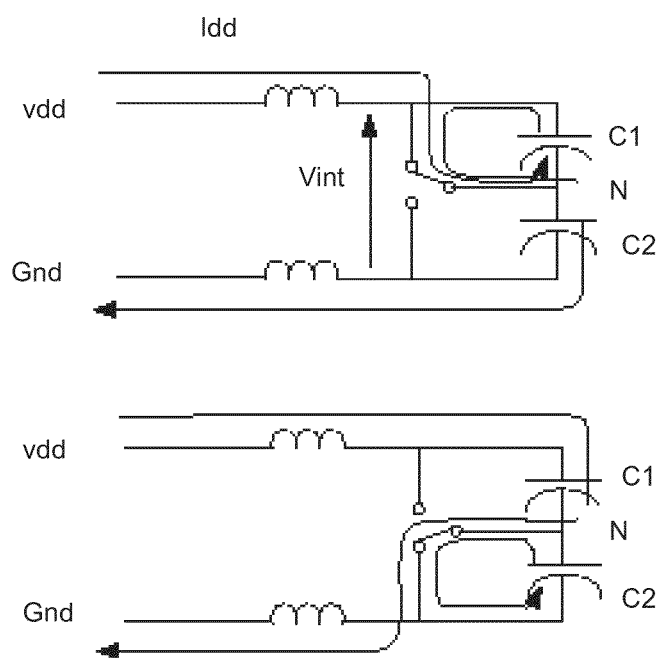
Figure 2A:
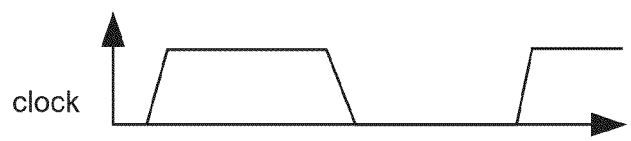
FIGS. 2a-2d illustrate the current and voltage characteristic of a system having logic current concentrated at the rising edge of the clock.
Figure 2B:
Figure 2C:
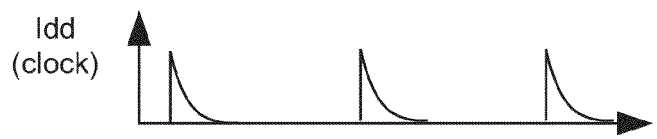
Figure 2D:
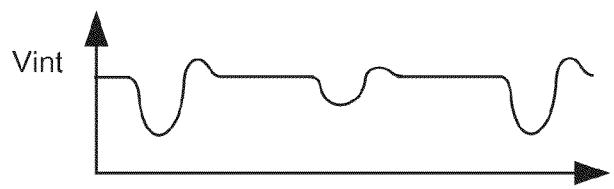

At 303 and 304, uniform current smearing is performed. If logic current is approximately equal during both rising and falling edges of clock cycles, it is preferred to balance the current generated by the clock. Uniform current smearing spreads the current generated by clock activity such that current in the clock network is evenly reduced during a clock cycle. According to an embodiment of the present invention, current may be smeared across both rising and falling edges of clock cycles by balancing the capacitive load, C1 and C2 (shown in FIG. 1), of the system. Balancing the capacitive load involves designing portions of the clock network to have a C1 value larger than C2 and designing other portions of the clock network to have a C2 value larger than C1.

Figure 5A:
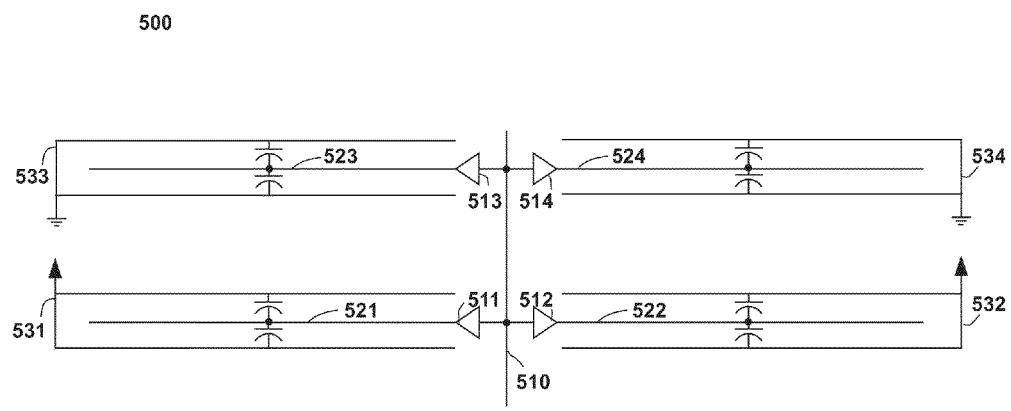
FIG. 5a illustrates alternating shields to ground and Vdd to distribute current spikes across a clock cycle according to an embodiment of the present invention.

At 303, current smearing is performed by using a mix of shield wires to Vdd and ground. FIG. 5a illustrates an exemplary portion of a clocking network 500 having alternating shields to ground and Vdd to distribute current spikes across a clock cycle. The clocking network 500 includes a clock line 510 of a first hierarchy. The clock line 510 is coupled to a plurality of clock activity program circuits 511-514 each of which feeds to a clock line 521-524 of a second hierarchy forming an H-tree structure. According to an embodiment of the present invention, the clock activity program circuits 511-514 are implemented by buffers which transmit an active high clock signal to clock lines 521-524. Each of the clock lines 521-524 has corresponding shield wires. A first plurality of shield wires 531-532 corresponding to clock lines 521-522 are coupled to Vdd. A second plurality of shield wires 533-534 corresponding to clock lines 523-524 are coupled to ground.

Figure 6:
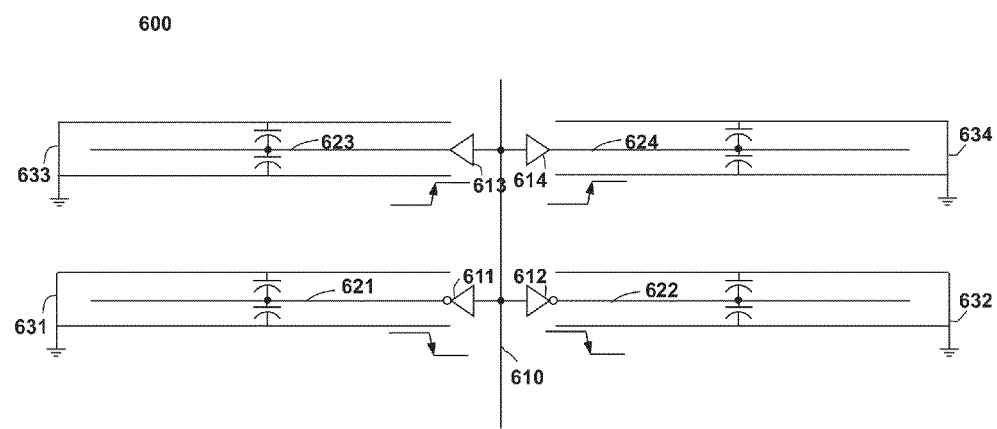
FIG. 6 illustrates mixing active high and active low clock wires to distribute current spikes across a clock cycle according to an embodiment of the present invention.

At 304, current smearing is performed by mixing active high and active low clock signals. FIG. 6 illustrates an exemplary portion of a clocking network 600 having a mix of active high and active low clock wires to distribute current spikes across a clock cycle. The clocking network 600 includes a clock line 610 of a first hierarchy. The clock line 610 is coupled to a plurality of clock activity program circuits 611-614 each of which feeds to a clock line 621-624 of a second hierarchy forming an H-tree structure. According to an embodiment of the present invention, the clock activity program circuits 611-612 are implemented by inverters which transmit an active low clock signal (nclk) to clock lines 621-622 while clock activity program circuits 613-614 are implemented by buffers which transmit an active high clock signal (clk) to clock lines 623-624. Each of the clock lines 621-624 has corresponding shield wires 631-634. The shield wires 631-634 are coupled to ground.

Figure 7:
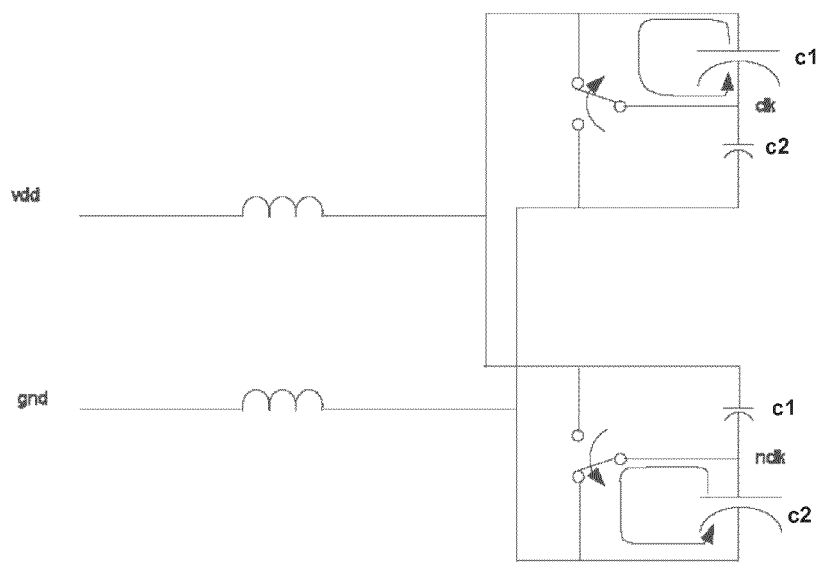
FIG. 7 illustrates an exemplary logic circuit that represents an abstraction of the system implemented on the target device after utilizing one of the procedures described in FIG. 6.

FIG. 7 illustrates an exemplary logic circuit that represents an abstraction of the system implemented on the target device after utilizing the clock network described in FIG. 6. The arrow represents the assertion of clk and nclk, which are rising and falling voltages respectively.

Figure 8A:
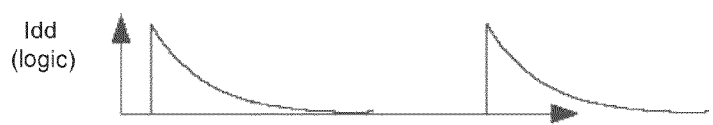
FIGS. 8a-8c illustrate the current and voltage characteristics of the system after utilizing the procedures described in FIG. 6.
Figure 8B:
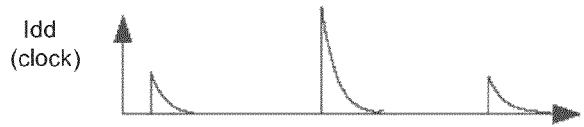
Figure 8C:
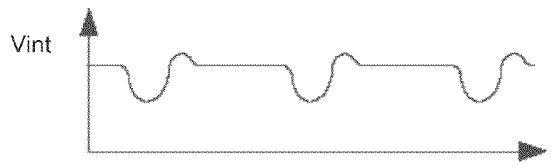

FIGS. 8a-8c illustrate the current and voltage characteristics of the system after utilizing the clock network described in FIG. 6. FIG. 8a illustrates the logic current for the system over time. FIG. 8b illustrates the combination of currents for the active high and active low clocks. By arranging that more of the clock current is conducted on the falling edge of the clock vs the rising edge, the bulk of the clock current is shifted to the falling clock edge. Thus the sum of logic and clock currents on rising and falling edges is closer to being equal. FIG. 8c illustrates the power supply voltage for the system over time. It should be appreciated that the current and voltage characteristics illustrated in FIGS. 8a-c are also achieved using the clock network described in FIG. 5.

Referring back to 305, if current is concentrated at the rising edge of a clock, control proceeds to one of 306-308. If current is not concentrated at the rising edge of a clock, control proceeds to 309 and terminates the procedure. As described previously, FIGS. 2a-2d illustrate the current and voltage characteristic of a system having logic current concentrated at the rising edge of the clock.

At 306, 307, and 308, clock current spikes are shifted to the falling edges of clock cycles. If the logic current is identified to be concentrated at the rising edge of a clock cycle, it may be preferable to concentrate the clock current spike at the falling edge of the clock. This may be achieved by skewing the sizes of C1 and C2 and arranging node N to be either charged or discharged during the least active part of the clock cycle. According to an embodiment of the present invention, if a clock network is the same polarity as the nominal clock, then increasing C1 and decreasing C2 will achieve the desired effect. In an embodiment of the present invention where the clock network has an active low polarity, decreasing C1 and increasing C2 will achieve the desired effect. It should be appreciated that a mix of active high and active low clocks with mixed shield capacitance may also be implemented.

Figure 9:
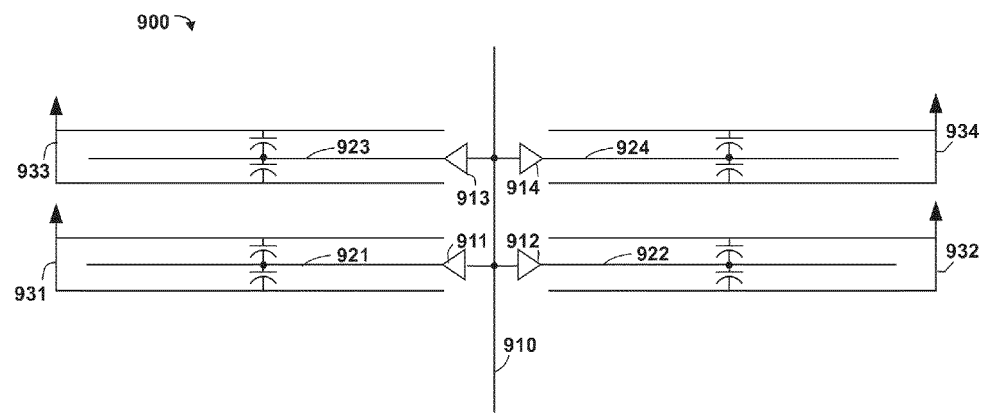
FIG. 9 illustrates configuring shield wires to Vdd to shift the clock current spikes to the falling edge of the clock cycle according to an embodiment of the present invention.

At 306, shifting current in a clock network to the falling edge of a clock cycle is performed by using connecting shield wires to Vdd. FIG. 9 illustrates an exemplary portion of a clocking network 900 having shield wires connected to Vdd to shift current spikes to a falling edges of clock cycles. The clocking network 900 includes a clock line 910 of a first hierarchy. The clock line 910 is coupled to a plurality of clock activity program circuits 911-914 each of which feeds to a clock line 921-924 of a second hierarchy forming an H-tree structure. According to an embodiment of the present invention, the clock activity program circuits 911-914 are implemented by buffers which transmit an active high clock signal to clock lines 921-924. Each of the clock lines 921-924 has corresponding shield wires. All of the shield wires of the clock network are coupled to Vdd. This results in having C1 increased and C2 decreased, leading the current spike of the clock network to occur primarily on the falling edge of the clock.

Figure 10:
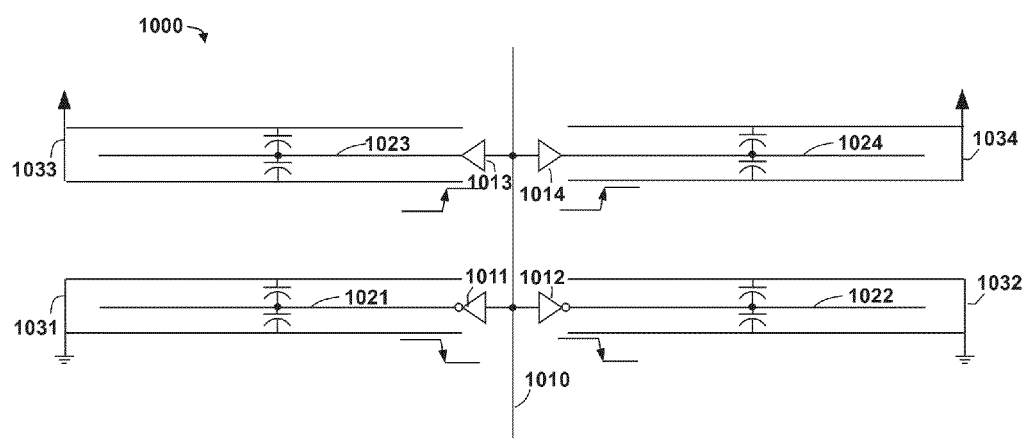
FIG. 10 illustrates alternating shields to ground and Vdd and mixing active high and active low clocks to shift clock current spikes to the falling edge of the clock cycle according to an embodiment of the present invention.

Referring back to FIG. 3, at 307, shifting current in a clock network to the falling edge of a clock cycle is performed by alternating shields to ground and Vdd and mixing active high and active low clocks. FIG. 10 illustrates an exemplary portion of a clock network 1000 having alternating shields to ground and Vdd and mixed active high and active low clocks to concentrate the clock current spikes at the falling edge of the clock cycle according to an embodiment of the present invention. The clocking network 1000 includes a clock line 1010 of a first hierarchy. The clock line 1010 is coupled to a plurality of clock activity program circuits 1011-1014 each of which feeds to a clock line 1021-1024 of a second hierarchy forming an H-tree structure. According to an embodiment of the present invention, the clock activity program circuits 1011-1012 are implemented by inverters which transmit an active low clock signal to clock lines 1021-1022 while the clock activity program circuits 1013-1014 are implemented by buffers which transmit an active high clock signal to clock lines 1023-1024. Each of the clock lines 1021-1024 has corresponding shield wires. A first plurality of shield wires 1031-1032 corresponding to clock lines 1021-1022 are coupled to ground. A second plurality of shield wires 1033-1034 corresponding to clock lines 1023-1024 are coupled to Vdd. This results in having C1 increased and C2 decreased, leading the current spike of the clock network to occur primarily on the falling edge of the clock.

Figure 11:
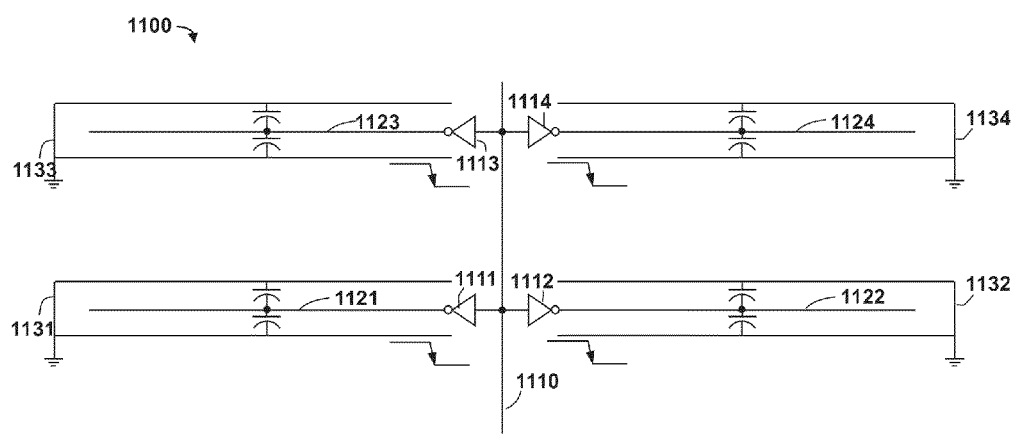
FIG. 11 illustrates configuring active low clock wires and configuring shield wires to ground to shift the clock current spikes to the falling edge of the clock cycle according to an embodiment of the present invention.

Referring back to FIG. 3, at 308, shifting current in a clock network to the falling edge of a clock cycle is performed by connecting shield wires to ground and transmitting an active low clock signal. FIG. 11 illustrates an exemplary portion of a clock network 1100 having active low clock wires and shield wires connected to ground to shift the clock current spikes to the falling edge of the clock cycle according to an embodiment of the present invention. The clocking network 1100 includes a clock line 1110 of a first hierarchy. The clock line 1110 is coupled to a plurality of clock activity program circuits 1111-1114 each of which feeds to a clock line 1121-1124 of a second hierarchy forming an H-tree structure. According to an embodiment of the present invention, the clock activity program circuits 1111-1114 are implemented by inverters which transmit an active low clock signal to clock lines 1121-1124. Each of the clock lines 1121-1124 has corresponding shield wires 1131-1134. All of the shield wires of the clock network are coupled to ground. This results in having C1 increased and C2 decreased, leading the current spike of the clock network to occur primarily on the falling edge of the clock.

Figure 12:
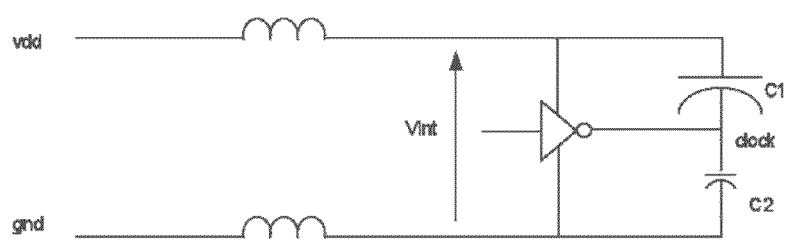
FIG. 12 illustrates an exemplary logic circuit that represents an abstraction of the system implemented on the target device after utilizing one of the procedures described in FIGS. 9 through 11.

FIG. 12 illustrates an exemplary logic circuit that represents an abstraction of the system implemented on the target device after utilizing the procedures described in FIG. 9.

Figure 13A:
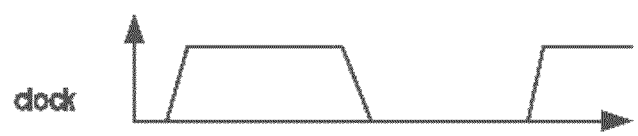
FIGS. 13a-13c illustrate the current and voltage characteristics of the system after utilizing one of the procedures descried in FIGS. 9 through 11.
Figure 13B:
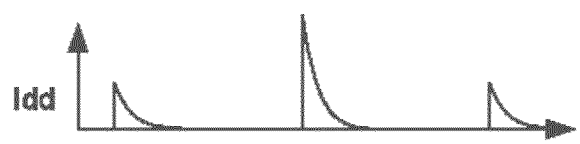
Figure 13C:
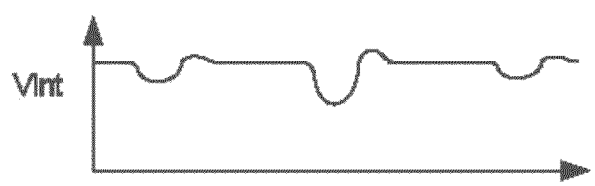

FIGS. 13a-13c illustrate the current and voltage characteristics of the clock network after utilizing the structure described in FIG. 9. FIG. 13a illustrates the active high clock pulse for the system over time. FIG. 13b illustrates the current for the clock network over time. As shown, a small current spike occurs during a rising edge of a clock signal and a larger spike occurs during a falling edge of a clock signal. By shifting the clock current to the falling edge of the clock cycle, a pair of unequal voltage transients of reduced magnitude at each clock edge as illustrated in FIG. 13c. It should be appreciated that the current and voltage characteristics illustrated in FIGS. 13b-13c are also achieved using the clock network described in FIGS. 10 and 11.

Figure 14:
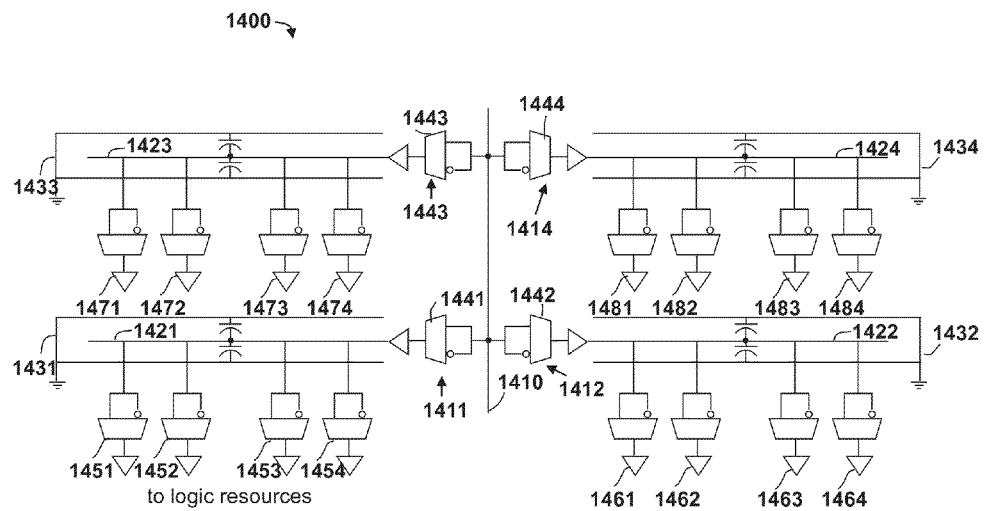
FIG. 14 illustrates a configurable clock polarity network according to an embodiment of the present invention.

FIG. 14 illustrates a portion of a configurable clock polarity network 1400 according to an embodiment of the present invention. The configurable clock polarity network 1400 may be implemented on a target device such as an FPGA. FPGAs have routing resources that are pre-fabricated on a chip. The capacitance associated with each clock wire is typically connected to a fixed terminal, either Gnd or Vdd. In order to perform uniform current smearing or shift a clock current spike to a falling edge of a clock cycle on an FPGA, the clock polarities and polarities of components on the FPGA may be configured using the configurable clock polarity network 1400. The configurable clock polarity network 1400 includes a clock line 1410 of a first hierarchy. The clock line 1410 is coupled to a plurality of clock activity program circuits 1411-1414 each of which feeds to a clock line 1421-1424 of a second hierarchy forming an H-tree structure. According to an embodiment of the present invention, each of the clock activity program circuits 1411-1414 includes a corresponding programmable clock inverter 1441-1444. Each of the programmable clock inverters 1441-1444 includes a multiplexer programmable to select one of an inverted and non-inverted clock signal from clock line 1410 to be output onto its corresponding clock line.

Each of the clock lines 1421-1424 is connected to a plurality of configurable inverter circuits. A configurable inverter circuit couples a clock line to a component on the system. Clock line 1421 includes configurable inverter circuits 1451-1454. Clock line 1422 includes configurable inverter circuits 1461-1464. Clock line 1423 includes configurable inverter circuits 1471-1474. Clock line 1424 includes configurable inverter circuits 1481-1484. Each of the configurable inverter circuits includes a multiplexer programmable to select one of an inverted and non-inverted path to transmit a clock signal to a component.

In order to manage power spikes, the polarity of some segments in a clock network can be chosen to complement the current spikes in the logic network. This may be done be performing a timing and switching window analysis to determine the expected shape of the logic current waveform. The clock polarity can then be set either globally or on a regional basis such that its current spikes occur when the logic current waveform is smaller.

As illustrated in FIG. 14, configurable clock polarity network 1400 may adjust the polarity of various segments of the network to minimize total power supply network noise. Configurable inverters are available downstream of the global clock network to compensate for possible inversion on the global clock network.

According to an embodiment of the present invention, the configurable clock polarity network 1400 may be coupled to its FPGA's clock multiplexing circuitry that allows one of several clock lines to be selected for a given clock signal. In this embodiment, approximately half the clock lines in a given region may be skewed so that the larger current spike occurs for a rising transition using shield wires coupled to ground, and the other half can be skewed so that the larger spike occurs for a falling edge by using shield wires coupled to Vdd. When an EDA tool is performing routing on the FPGA and is determining which clock lines to use, it can be biased or constrained to select the clock lines in the region that produces the desired current spike behavior. For example, if in a given region the logic current waveform is higher at the falling clock edge, the router may select clock lines in the region that produce a current spike on a rising transition such as clock lines having shields connected to ground.

According to an embodiment of the present invention, an EDA tool selects clock lines that produce a current spike on a falling transition because that is the inactive edge of a clock. To accommodate this biased demand, a programmable inversion can be added at the clock source. This, combined with configurable inversions at the destination registers would allow the EDA tool to make use of clock lines that produce a current spike on a rising transition for a positive edge triggered clock domain. A rising transition through the clock network now corresponds with the negative (inactive) edge of the clock and would likely lower logic current demand.

Figure 5B:
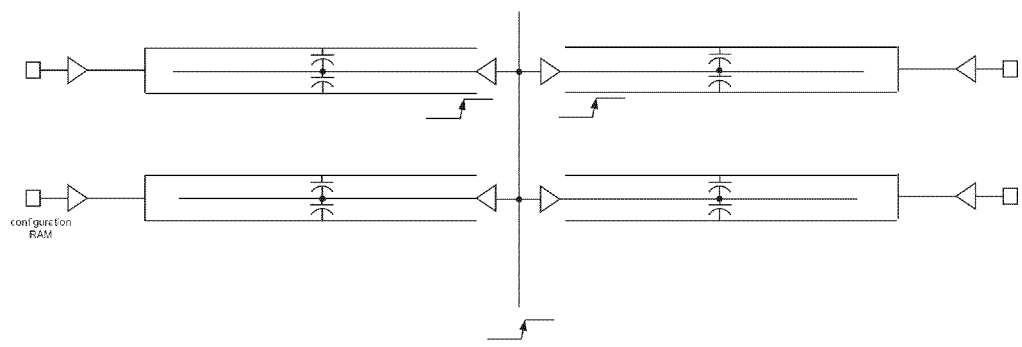
FIG. 5b illustrates configurable clock shields to distribute current spikes across a clock cycle according to an embodiment of the present invention.

FIG. 5b illustrates an alternate embodiment of the present invention, the clock shield line can be configurably connected to either Vdd or Gnd by a buffer that configurably drives either a high or low voltage on each clock shield line. When the voltage driven is high, the buffer forms an electrical connection to Vdd and when the voltage driven is low, the buffer forms an electrical connection to Gnd. The same EDA flow used for FIG. 5a may be applied to the assignment of shield wire voltages.

Figure 15:
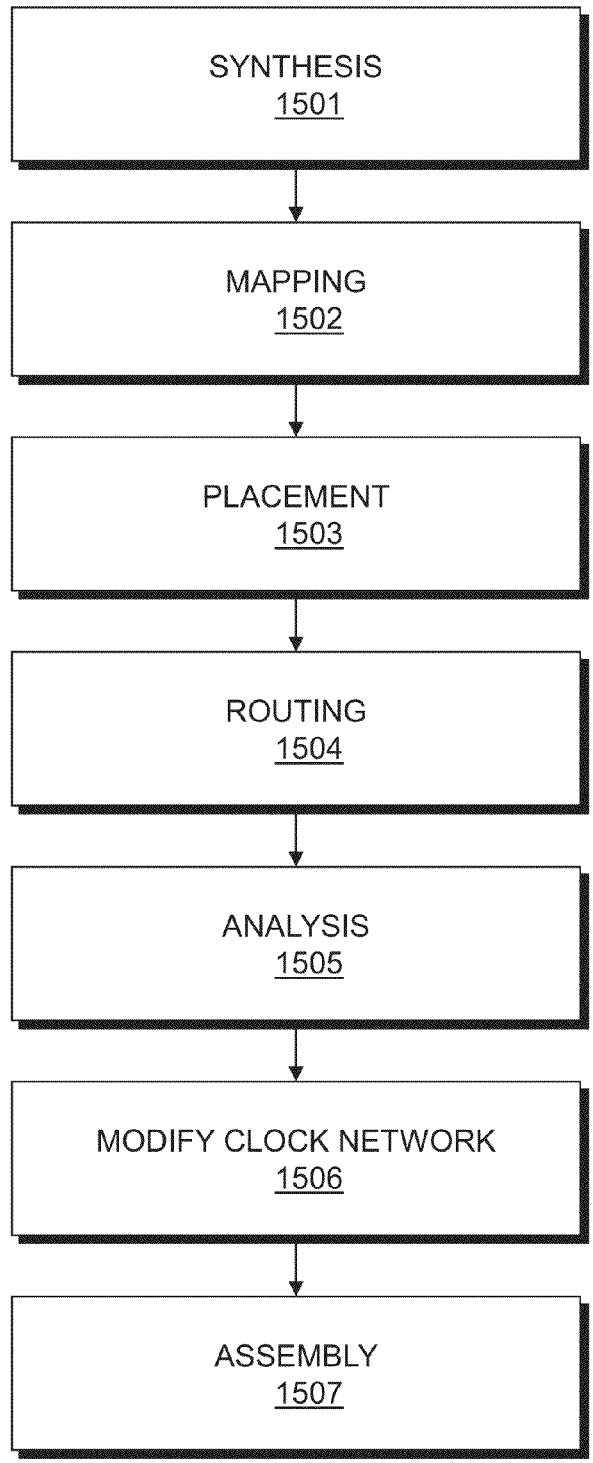
FIG. 15 is a flow chart illustrating a method for designing a clock network for a system on a target device according to an embodiment of the present invention.

FIG. 15 is a flow chart illustrating a method for designing a clock network for a system on a target device according to an embodiment of the present invention. At 1501, synthesis is performed on a design of a system. According to an embodiment of the present invention, synthesis generates an optimized logical representation of the system from a HDL design definition. The optimized logical representation of the system may include a representation that has a minimized number of functional blocks such as logic gates, logic elements, and registers required for the system At 1502, technology mapping is performed on the optimized logic design. Technology mapping includes determining how to implement logic gates and logic elements in the optimized logic representation with resources available on the target device. The resources available on the target device may be referred to as "cells" or "components" and may include logic-array blocks, registers, memories, digital signal processing blocks, input output elements, and/or other components. According to an embodiment of the present invention, an optimized technology-mapped netlist (cell netlist) is generated from the HDL.

At 1503, the mapped logical system design is placed. Placement works on the optimized technology-mapped netlist to produce a placement for each of the functional blocks. According to an embodiment of the present invention, placement includes fitting the system on the target device by determining which resources available on the target device are to be used for specific function blocks in the optimized technology-mapped netlist. According to an embodiment of the present invention, placement may include clustering which involves grouping logic elements together to form the logic clusters present on the target device.

At 1504, the system is routed. Routing the mapped logical system design involves determining which routing resources should be used to connect the components in the target device implementing the functional blocks of the system. During routing, routing resources on the target device are allocated to provide interconnections between logic gates, logic elements, and other components on the target device. The routing procedure may be performed by a router in an EDA tool that utilizes routing algorithms.

At 1505, an analysis is performed on the solution generated from procedures 1501-1504. According to an embodiment of the present invention, the analysis includes a timing analysis that determines the possible switching times for each node in the circuit. Current waveforms may be generated by adding a current draw proportional to the capacitance of each node at each point where it can switch. The current draw may be multiplied by a transition probability to weight the current draw. Transition probabilities can be calculated by various methods used to estimate power consumption. The analysis produces an estimate of logic current draw.

At 1506, modifications are made to the clock network, when needed, in order to reduce power spikes. The modifications may be achieved by configuring the clock activity program circuits and/or configurable inverter circuits in the configurable clock polarity network of the target device.

At 1507, an assembly procedure is performed. The assembly procedure involves creating a data file that includes some of the information determined by the procedure described by 1501-1507. The data file may be a bit stream that may be used to program the target device. According to an embodiment of the present invention, when a target device is programmed, resources on the target device are physically transformed to implement components in the system. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

Figure 16:
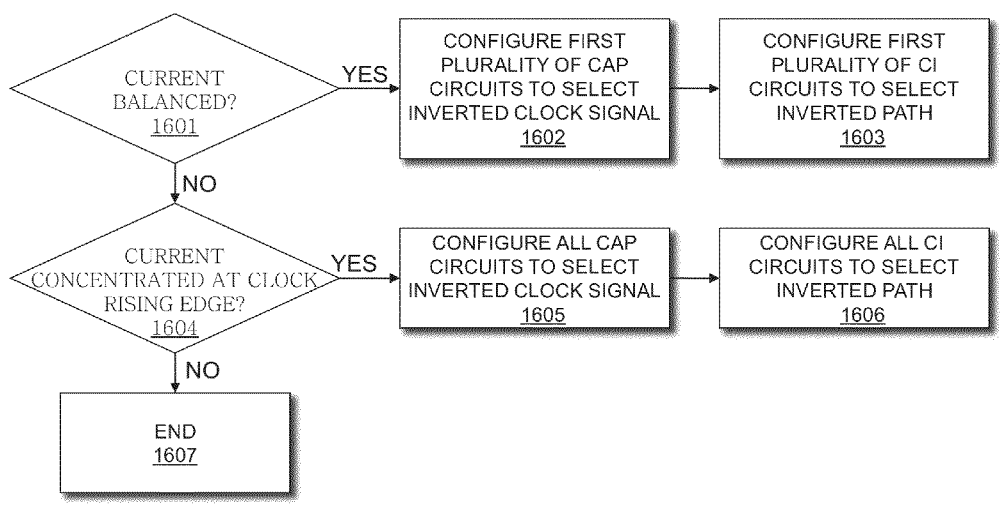
FIG. 16 is a flow chart illustrating a method for configuring a configurable clock polarity network on a target device according to an embodiment of the present invention.

FIG. 16 is a flow chart illustrating a method for configuring a configurable clock polarity network on a target device according to an embodiment of the present invention. The procedure illustrated in FIG. 16 may be used at 1506 in FIG.

15. At 1601, if it is determined that current levels are approximately the same across clock cycles, control proceeds to 1602. If it is determined that current levels are not approximately the same across clock cycles, control proceeds to 1604.

At 1602, uniform current smearing is performed. If logic current is approximately equal during both rising and falling edges of clock cycles, it is preferred to balance the current generated by the clock. Uniform current smearing spreads the current generated by clock activity such that current in the clock network is evenly reduced during a clock cycle. According to an embodiment of the present invention, current may be smeared across both rising and falling edges of clock cycles by balancing the capacitive load, C1 and C2 (shown in FIG. 1), of the system. Balancing the capacitive load involves designing portions of the clock network to have a C1 value larger than C2 and designing other portions of the clock network to have a C2 value larger than C1. According to an embodiment of the present invention where the configurable clock polarity network is implemented using the configuration illustrated in FIG. 14, a first plurality of clock activity program circuits is selected to invert a clock signal to output to a first plurality of clock lines in the target device and a second plurality of clock activity program circuit is selected to output a non-inverted clock signal to output to a second plurality of clock lines in the target device.

At 1603, a first plurality of configurable inverter circuits corresponding to components on the first plurality of clock lines are configured to select an inverted path to change the inverted clock signal to a non-inverted signal to the components.

At 1604, if it is determined that current levels are concentrated at the rising edge of a clock, control proceeds to 1605. If it is determined that current levels are not concentrated at the rising edge of a clock, control proceeds to 1607 and terminates the procedure.

At 1605, clock current spikes are shifted to the falling edges of clock cycles. If the logic current is identified to be concentrated at the rising edge of a clock cycle, it may be preferable to concentrate the clock current spike at the falling edge of the clock. This may be achieved by skewing the sizes of C1 and C2 and arranging node N to be either charged or discharged during the least active part of the clock cycle. According to an embodiment of the present invention, if a clock network is the same polarity as the nominal clock, then increasing C1 and decreasing C2 will achieve the desired effect. In an embodiment of the present invention where the clock network has an active low polarity, decreasing C1 and increasing C2 will achieve the desired effect. According to an embodiment of the present invention, shifting current in a clock network to the falling edge of a clock cycle is performed by configuring activity program circuits in the configurable clock polarity network to invert a clock signal to be transmitted to all the clock lines on the target device.

At 1606, all of the configurable inverter circuits corresponding to components on the clock lines are configured to select an inverted path to change the inverted clock signal to a non-inverted signal to the components.

Figure 20:
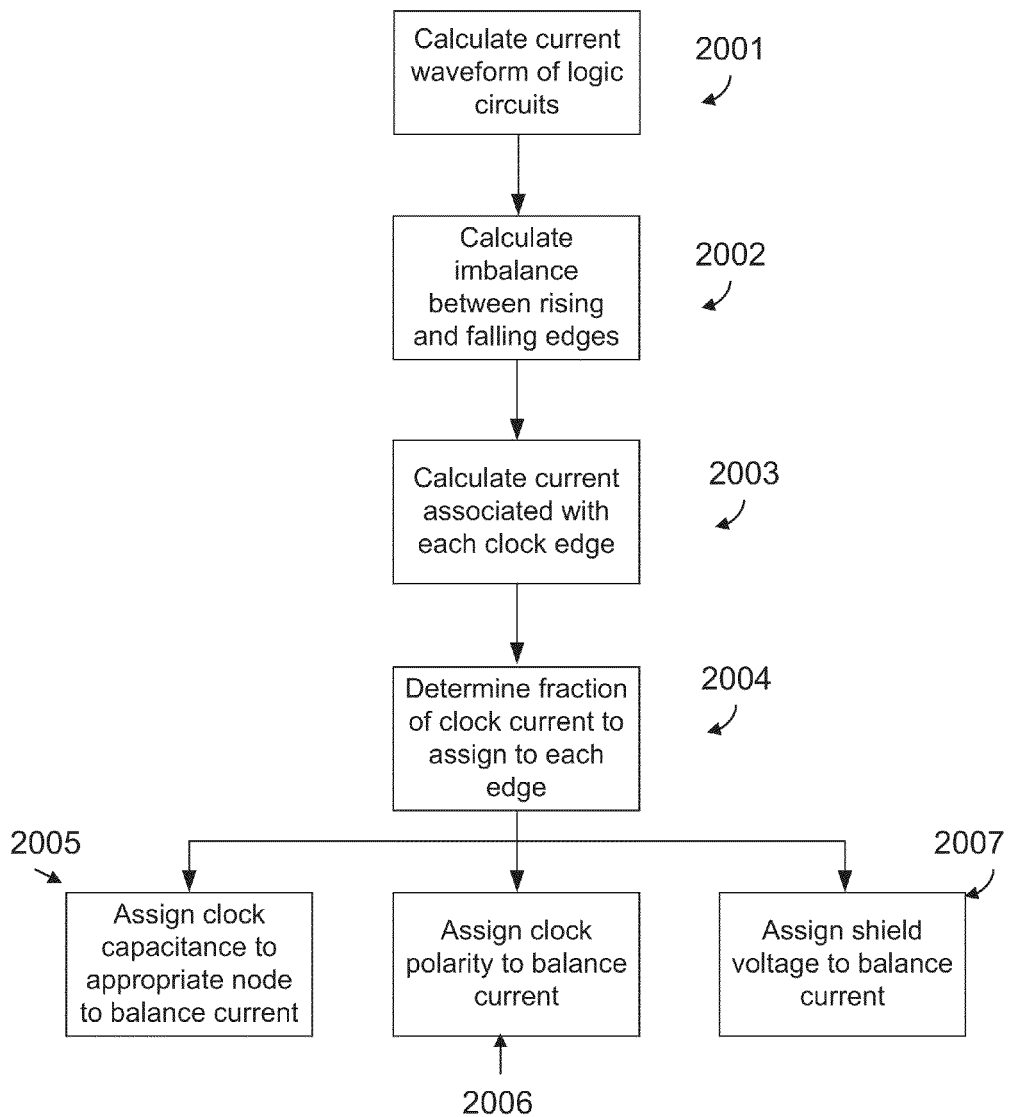
FIG. 20 illustrates an alternate method for designing a clock network for a system on a target device.

According to an alternate embodiment of the present invention, FIG. 20 illustrates an alternate method for designing a clock network for a system on a target device. This method involves calculating a current waveform across a clock cycle, determining differences between current at a rising and falling edges of the clock, determining an amount of clock current to assign each clock edge, and adjusting the clock network to balance currents at rising and falling edges. If there is a small imbalance between rising and falling edges, then the clocks should be configured with a nearly equal cap to Vdd and Gnd to compensate.

At 2001, a current waveform associated with the logic circuits is determined.

At 2002, the waveform is examined to determine the imbalance between rising and falling edges.

At 2003, the amount of current associated with the clock network transitions is determined.

At 2004, the amount of clock current to associate with the rising and falling edges is determined.

At 2005-2007, one or more of the methods of assigning shield capacitance to Vdd or Gnd, choosing a clock polarity, or configurably assigning a shield voltage is used to balance the current as much as possible within the constraints of the logic and clock current demands.

Figure 17:
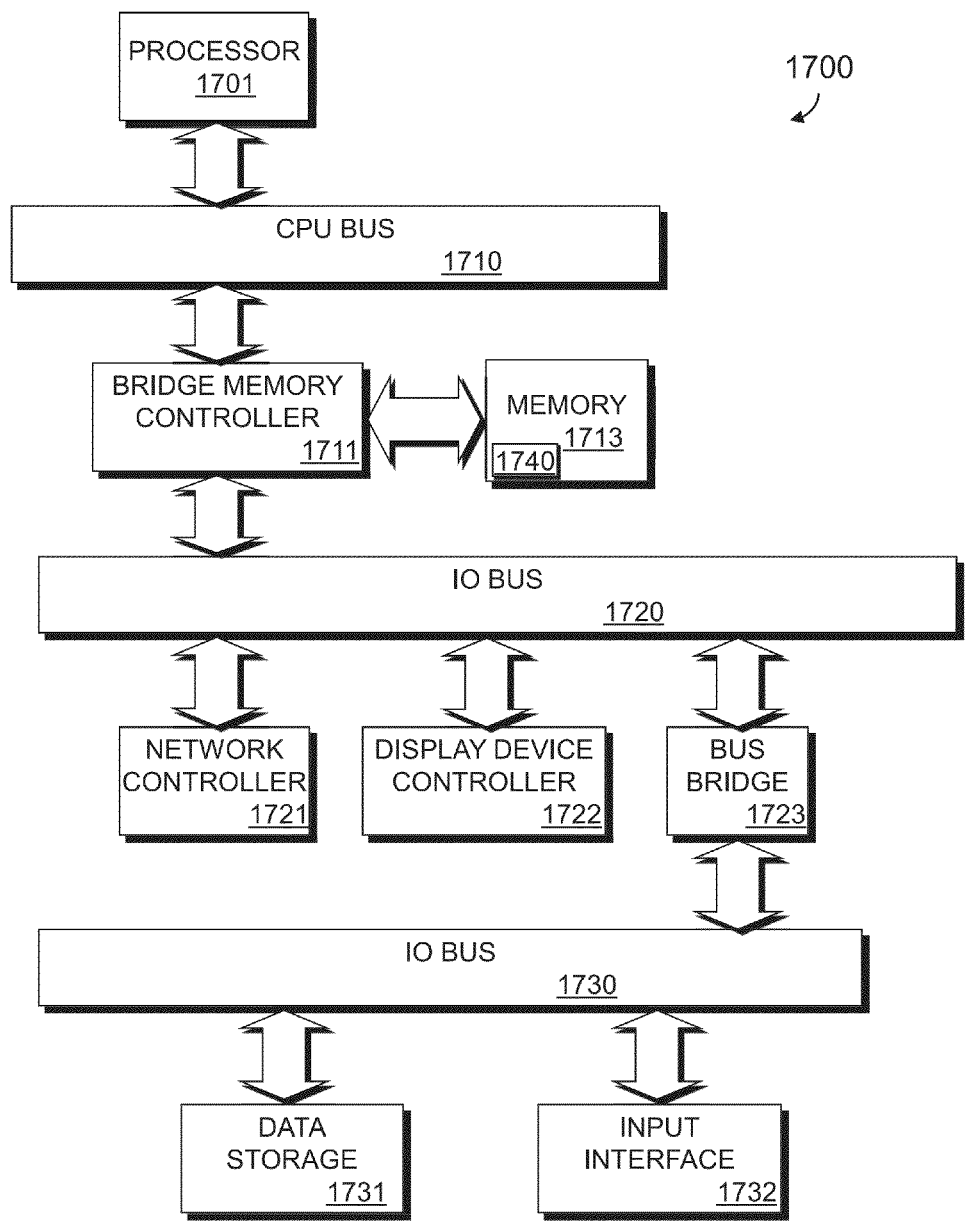
FIG. 17 illustrates a computer system implementing a system designer according to an embodiment of the present invention.
Figure 18:
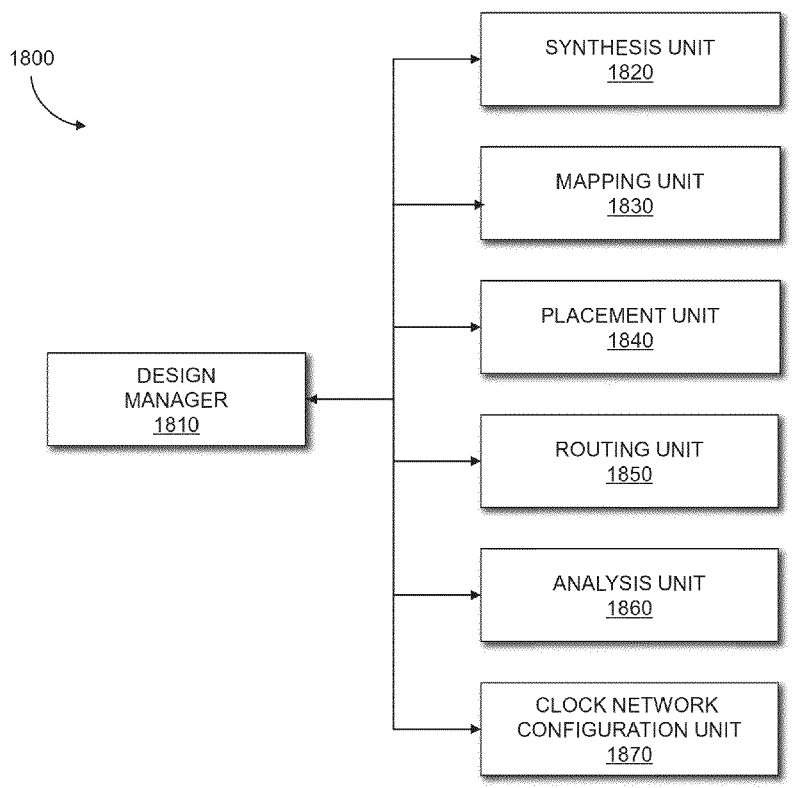
FIG. 18 illustrates a system designer according to an embodiment of the present invention.

FIG. 17 is a block diagram of an exemplary computer system 1700 in which an example embodiment of the present invention resides. The computer system 1700 may be used to implement a system designer as shown in FIG. 18. The computer system 1700 includes a processor 1701 that processes data signals. The processor 1701 is coupled to a CPU bus 1710 that transmits data signals between processor 1701 and other components in the computer system 1700.

The computer system 1700 includes a memory 1713. The memory 1713 may store instructions and code represented by data signals that may be executed by the processor 1701.

A bridge memory controller 1711 is coupled to the CPU bus 1710 and the memory 1713. The bridge memory controller 1711 directs data signals between the processor 1701, the memory 1713, and other components in the computer system 1700 and bridges the data signals between the CPU bus 1710, the memory 1713, and a first IO bus 1720.

The first IO bus 1720 may be a single bus or a combination of multiple buses. The first IO bus 1720 provides communication links between components in the computer system 1700. A network controller 1721 is coupled to the first IO bus 1720. The network controller 1721 may link the computer system 1700 to a network of computers (not shown) and supports communication among the machines. A display device controller 1722 is coupled to the first IO bus 1720. The display device controller 1722 allows coupling of a display device (not shown) to the computer system 1700 and acts as an interface between the display device and the computer system 1700.

A second IO bus 1730 may be a single bus or a combination of multiple buses. The second IO bus 1730 provides communication links between components in the computer system 1700. A data storage device 1731 is coupled to the second IO bus 1730. The data storage device 1731 may be a hard disk drive, a floppy disk drive, a CD-ROM device, a flash memory device or other mass storage device. An input interface 1732 is coupled to the second IO bus 1730. The input interface 1732 may be, for example, a keyboard and/or mouse controller or other input interface. The input interface 1732 may be a dedicated device or can reside in another device such as a bus controller or other controller. The input interface 1732 allows coupling of an input device to the computer system 1700 and transmits data signals from an input device to the computer system 1700. A bus bridge 1723 couples the first IO bus 1720 to the second IO bus 1730. The bus bridge 1723 operates to buffer and bridge data signals between the first IO bus 1720 and the second 10 bus 1730. It should be appreciated that computer systems having a different architecture may also be used to implement the computer system 1700.

A system designer 1740, may reside in memory 1713 and be executed by processor 1701. The system designer 1740 may operate to synthesize a system, map the system, place the system on a target device, route the system, perform analysis on a design for the system, and modify the clock network of the system to reduce power spikes if needed.

FIG. 18 illustrates a system designer 1800 according to an embodiment of the present invention. The system designer 1800 may be an EDA tool for designing a system on a target device. The target device may be, for example, an FPGA, a PLD, or other circuitry. Furthermore the logic design may be implemented using semiconductor or nanoelectronic technology. FIG. 18 illustrates software modules implementing an embodiment of the present invention. According to one embodiment, system design may be performed by a computer system executing sequences of instructions represented by the software modules shown in FIG. 18. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 1800 includes a designer manager 1810. The designer manager 1810 receives a design for a system. The design may be described at a gate level or in a more abstract level. The design may be described in terms of an HDL such as VHDL or Verilog. The target device may be an ASIC, structured ASIC, FPGA, PLD, or other target device. The designer manager 1810 is connected to and transmits data between the components of the system designer 1800.

Block 1820 represents a synthesis unit that performs synthesis. The synthesis unit 1820 generates a logic design of a system to be implemented in the target device. According to an embodiment of the system designer 1800, the synthesis unit 1820 takes a conceptual HDL design definition and generates an optimized logical representation of the system. The optimized logical representation of the system generated by the synthesis unit 1820 may include a representation that has a minimized number of functional blocks and registers, such as logic gates and logic elements, required for the system. Alternatively, the optimized logical representation of the system generated by the synthesis unit 1820 may include a representation that has a reduced depth of logic and that generates a lower signal propagation delay.

Block 1830 represents a mapping unit. The mapping unit 1830 performs technology mapping. Technology mapping involves determining how to implement the functional blocks and registers in the optimized logic representation utilizing specific resources on a target device thus creating an optimized "technology-mapped" netlist. The technology-mapped netlist illustrates how the resources (components) on the target device are utilized to implement the system.

Block 1840 represents a placement unit that performs placement. The placement unit 1840 places the system on to the target device by determining which components or areas on the target device are to be used for specific functional blocks and registers. According to an embodiment of the system designer 1800, the placement unit 1840 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 1840 may utilize a cost function in order to determine a good assignment of resources on the target device.

Block 1850 represents a routing unit 1850 that determines the routing resources on the target device to use to provide interconnection between the components implementing functional blocks and registers of the logic design.

Block 1860 represents an analysis unit. The analysis unit 1860 may perform timing analysis to determine the possible switching times for each node in the system. Current waveforms may be generated by adding a current draw proportional to the capacitance of each node at each point where it can switch. The current draw may be multiplied by a transition probability to weight the current draw. Transition probabilities can be calculated by various methods used to estimate power consumption. The analysis produces an estimate of logic current draw.

Block 1870 represents a clock network configuration unit. The clock network configuration unit 1870 evaluates the analysis performed by the analysis unit 1860 and determines whether to make modifications on the clock network to reduce power spikes. The modifications may be achieved by configuring the clock activity program circuits and/or configurable inverter circuits in the configurable clock polarity network of the target device to perform uniform current smearing or shifting of clock current spikes to falling edges of clocks.

According to an embodiment of the system designer 1800, the design manager 1810 also performs an assembly procedure that creates a data file that includes the design of the system generated by the system designer 1800. The data file may be a bit stream that may be used to program the target device. The design manager 1810 may output the data file so that the data file may be stored or alternatively transmitted to a separate machine used to program the target device. It should be appreciated that the design manager 1810 may also output the design of the system in other forms such as on a display device or other medium.

Figure 19:
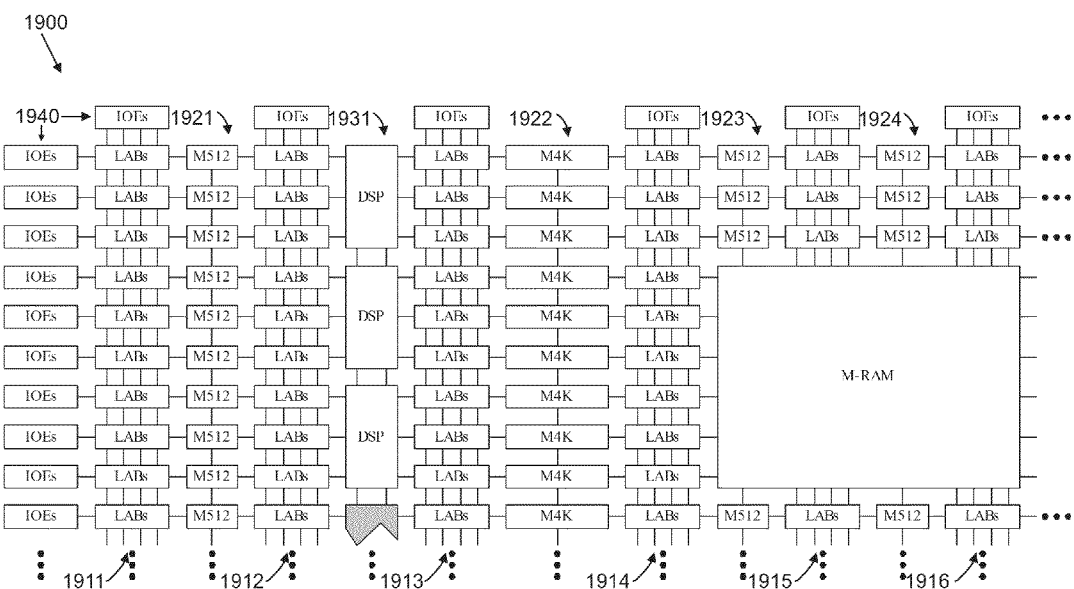
FIG. 19 illustrates a target device according to an embodiment of the present invention.

FIG. 19 illustrates an exemplary target device 1900 in which a system may be implemented on utilizing an FPGA according to an embodiment of the present invention. According to one embodiment, the target device 1900 is a chip having a hierarchical structure that may take advantage of wiring locality properties of circuits formed therein.

The target device 1900 includes a plurality of logic-array blocks (LABs). Each LAB may be formed from a plurality of logic blocks or logic elements, carry chains, shared arithmetic chains, LAB control signals, and register chain connection lines. A logic block is a small unit of logic providing efficient implementation of user logic functions. A logic block includes one or more LUT-based resources, logic gates, programmable registers, and a single output. Depending on its architecture, a logic block may also include dedicated adders, a carry chain, an arithmetic chain, and a register train. LABs are grouped into rows and columns across the target device 1900. Columns of LABs are shown as 1911-1916. It should be appreciated that the logic block may include additional or alternate components.

The target device 1900 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 900. Columns of memory blocks are shown as 1921-1924.

The target device 1900 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 1900 and are shown as 1931.

The target device 1900 includes a plurality of input/output elements (IOEs) 1940. Each IOE feeds an I/O pin (not shown) on the target device 1900. The IOEs are located at the end of LAB rows and columns around the periphery of the target device 1900.

The target device 1900 includes LAB local interconnect lines (not shown) that transfer signals between LEs in the same LAB, a plurality of row interconnect lines ("H-type wires") (not shown) that span fixed distances, and a plurality of column interconnect lines ("V-type wires") (not shown) that operate similarly to route signals between components in the target device. The target device 1900 also includes a clock network (not shown) which transmits clock signals to components on the target device. The clock network may include the configurable clock polarity network which is shown in part on FIG. 14.

FIG. 19 illustrates an exemplary embodiment of a target device. It should be appreciated that a system may include a plurality of target devices, such as that illustrated in FIG. 19, cascaded together. It should also be appreciated that the target device may include programmable logic devices arranged in a manner different than that on the target device 1900. A target device may also include FPGA resources other than those described in reference to the target device 1900. Thus, while the invention described herein may be utilized on the architecture described in FIG. 19, it should be appreciated that it may also be utilized on different architectures, such as those employed by Altera Corporation or Xilinx Inc.

FIGS. 3, 15, and 16 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. For example, the configurable clock polarity network illustrated in FIG. 14 is shown to have its shield wires connected to ground. It should be appreciated that some or all of the shield wires may be connected to Vdd. In these alternate embodiments, alternative methodolgies for configuring the configurable clock polarity network to perform uniform current smearing and shifting of clock current spikes may be performed in addition to those illustrated in FIG. 16 to form configurations having characteristics similar to those illustrated in FIGS. 5, 9, and 10. The specification and drawings are, accordingly, to be regarded in an illustrative rather than restrictive sense.

What is claimed is:

1. A method for managing a clock network on a target device, comprising:
   determining a current level of a system relative to edges of a clock signal;
   programming a first plurality of clock activity program circuits coupled to a first plurality of clock lines, in response to the current level by selecting one of an inverted and non-inverted signal produced from the clock signal to output onto the first plurality of clock lines; and
   programming a second plurality of clock activity circuits coupled to a second plurality of clock lines in response to the current level by selecting one of an inverted and non-inverted signal produced from the clock signal to output onto the second plurality of clock lines.

2. The method of claim 1, wherein the first plurality of clock activity program circuits is programmed to an active high and the second plurality of program circuits is programmed to an active low in response to determining that the current level is balanced across the edges of the clock cycle.

3. The method of claim 1, wherein the first plurality of clock activity program circuits is programmed to an active low and the second plurality of program circuits is programmed to an active low in response to determining that the current level is concentrated at a rising edge of the clock cycle.

4. The method of claim 1 further comprising programming a first plurality of configurable inverter circuits coupled between the first plurality of clock lines and a first plurality of components in response to the current level and programming a second plurality of configurable inverter circuits coupled between the second plurality of clock lines and a second plurality of components in response to the current level.

5. The method of claim 4, wherein the first plurality of configurable inverter circuits is programmed to select an inverted path from the first plurality of clock lines to the first plurality of components.

6. The method of claim 4, wherein the first plurality of configurable inverter circuits is programmed to select an inverted path from the first plurality of clock lines to the first plurality of components, and the second plurality of configurable inverter circuits is programmed to select an inverted path from the second plurality of clock lines to the second plurality of components.

7. The method of claim 1 further comprising programming a first plurality of shield wires associated with the first plurality of clock lines and programming a second plurality of shield wires associated with the second plurality of clock lines in response to the current level, wherein the first plurality of clock lines is shielded by only the first plurality of shield wires and the second plurality of clock lines is shielded by only the second plurality of shield wires.

8. The method of claim 7, wherein the first plurality of shield wires is programmed to be coupled to Vdd and the second plurality of shield wires is programmed to be coupled to ground.

9. The method of claim 7, wherein the first plurality of shield wires is programmed to be coupled to Vdd and the second plurality of shield wires is programmed to be coupled to Vdd.

10. The method of claim 1, wherein the determining and programming are performed after synthesis, placement, and routing of a system on the target device.

11. A method for managing a clock network on a target device, comprising:
   determining a current level of a system relative to edges of a clock signal;
   programming a first plurality of shield wires associated with a first plurality of clock lines in response to the current level by coupling the first plurality of shield wires to one of a selected Vdd and ground; and
   programming a second plurality of shield wires associated with a second plurality of clock lines in response to the current level by coupling the second plurality of shield wires to one of a selected Vdd and ground.

12. The method of claim 11, wherein the first plurality of shield wires is programmed to be coupled to Vdd and the second plurality of shield wires is programmed to be coupled to ground in response to determining that the current level is balanced across the edges of the clock signal.

13. The method of claim 11, wherein the first plurality of shield wires is programmed to be coupled to Vdd and the second plurality of shield wires is programmed to be coupled to Vdd in response to determining that the current level is concentrated at a rising edge of the clock signal.

14. The method of claim 11 further comprising programming a first plurality of clock activity program circuits coupled to the first plurality of clock lines in response to the current level and programming a second plurality of clock activity circuits coupled to the second plurality of clock lines in response to the current level.

15. The method of claim 11, wherein the first plurality of clock activity program circuits is programmed to an active high and the second plurality of program circuits is programmed to an active low in response to determining that the current level is balanced across the edges of the clock cycle.

16. The method of claim 11, wherein the first plurality of clock activity program circuits is programmed to an active low and the second plurality of program circuits is programmed to an active low in response to determining that the current level is concentrated at a rising edge of the clock cycle.

17. The method of claim 11, wherein the determining and programming are performed after synthesis, placement, and routing of a system on the target device.

18. The method of claim 11, wherein the first plurality of clock lines is shielded by only the first plurality of shield wires and the second plurality of clock lines is shielded by only the second plurality of shield wires.

19. A non-transitory machine-readable medium including sequences of instructions, the sequences of instructions including instructions which when executed causes a machine to perform a method comprising:
   determining a current level of a system relative to edges of a clock signal; and
   programming a first plurality of clock activity program circuits coupled to a first plurality of clock lines in response to the current level by selecting one of an inverted and non-inverted signal produced from the clock signal to output onto the first plurality of clock lines, and programming a second plurality of clock activity circuits coupled to a second plurality of clock lines in response to the current level by selecting one of an inverted and non-inverted signal produced from the clock signal to output onto the second plurality of clock lines.

20. The non-transitory machine-readable medium of claim 19, wherein the first plurality of clock activity program circuits is programmed to an active high and the second plurality of program circuits is programmed to an active low in response to determining that the current level is balanced across the edges of the clock cycle.

21. The non-transitory machine-readable medium of claim 19, wherein the first plurality of clock activity program circuits is programmed to an active low and the second plurality of program circuits is programmed to an active low in response to determining that the current level is concentrated at a rising edge of the clock cycle.

22. A non-transitory machine-readable medium including sequences of instructions, the sequences of instructions including instructions which when executed causes a machine to perform a method comprising:
   determining a current level of a system relative to edges of a clock signal; and
   programming a first plurality of shield wires associated with a first plurality of clock lines in response to the current level by coupling the first plurality of shield wires to one of a selected Vdd and ground, and programming a second plurality of shield wires associated with a second plurality of clock lines in response to the current level by coupling the second plurality of shield wires to one of a selected Vdd and ground.

23. The non-transitory machine-readable medium of claim 22, wherein the first plurality of shield wires is programmed to be coupled to Vdd and the second plurality of shield wires is programmed to be coupled to ground in response to determining that the current level is balanced across the edges of the clock signal.

24. The non-transitory machine-readable medium of claim 22, wherein the first plurality of shield wires is programmed to be coupled to Vdd and the second plurality of shield wires is programmed to be coupled to Vdd in response to determining that the current level is concentrated at a rising edge of the clock signal.

* * * * *